United States Patent [19]

Ohishi et al.

[11] 4,291,117
[45] Sep. 22, 1981

[54] PLATE MAKING PROCESS WITH NOVEL USE OF SURFACTANT

[75] Inventors: Chikashi Ohishi; Akira Hasegawa, both of Shizuoka, Japan

[73] Assignee: Fuji Photo Film Co., Ltd., Minami-ashigara, Japan

[21] Appl. No.: 125,056

[22] Filed: Feb. 27, 1980

[30] Foreign Application Priority Data

Feb. 27, 1979 [JP] Japan .................................. 54/22297

[51] Int. Cl.$^3$ ................................................ G03C 7/08
[52] U.S. Cl. .................................... 430/309; 430/278; 430/302
[58] Field of Search ......................... 430/278, 302, 309

[56] References Cited

U.S. PATENT DOCUMENTS

| | | | |
|---|---|---|---|
| 3,635,709 | 1/1972 | Kobayashi | 430/302 |
| 4,028,111 | 6/1977 | Iwasaki et al. | 430/302 |
| 4,139,384 | 2/1979 | Iwasaki et al. | 430/190 |
| 4,186,250 | 1/1980 | Garrett et al. | 430/309 |
| 4,189,320 | 2/1980 | Hsieh | 430/278 |

OTHER PUBLICATIONS

Translation of Japanese Unexamined Patent Publication (OPI), No. 8002/79.

*Primary Examiner*—Jack P. Brammer
*Attorney, Agent, or Firm*—Sughrue, Mion, Zinn, Macpeak and Seas

[57] ABSTRACT

In a plate-making process comprising the steps of (a) imagewise exposing a presensitized plate comprising an aluminum support having thereon a light-sensitive layer, (b) developing the imagewise exposed presensitized plate to remove either the exposed area or the unexposed area of the light-sensitive layer to reveal the surface of the aluminum support and (c) subjecting the developed plate to a process selected from the group consisting of (i) application of a developing ink, (ii) retouching process and (iii) gumming process, the improvement which comprises processing the developed plate with an aqueous surfactant solution directly after the step of (b).

14 Claims, No Drawings

PLATE MAKING PROCESS WITH NOVEL USE OF SURFACTANT

BACKGROUND OF THE INVENTION

1. Field of the Invention

This invention relates to a plate-making process for the production of a lithographic printing plate from a presensitized plate and, more particularly, it relates to a plate-making process in which a water-washing step to be effected after development is eliminated.

2. Description of the Prior Art

Japanese Unexamined Patent Publication (OPI) No. 8002/79 discloses a plate-making process comprising the steps of imagewise exposing a light sensitive lithographic printing plate which is generally called "presensitized plate" and abbreviated to "PS plate", developing and then subjecting the imagewise exposed plate to the gumming treatment without being washed with water. This plate-making process is advantageous from the point of waste liquor disposal because the water-washing step is eliminated. In this process, however, the consumption of a desensitizer gum for use in the gumming treatment is marked and moreover it suffers from disadvantages in the application of a developing ink and the retouching process.

In a process wherein the application of a developing ink is carried out prior to the gumming treatment, that is, a lithographic printing plate prepared by exposure and development of a PS plate is subjected to the application of a developing ink without being washed with water, it has been found that the attraction of the developing ink onto image areas of the lithographic printing plate is not sufficient and a long period of time is required for the application of a developing ink, thereby resulting in a marked reduction in operation efficiency.

SUMMARY OF THE INVENTION

An object of this invention is to provide a plate-making process which enables to effectively conduct the gumming treatment after exposure and development of a PS plate without conducting water-washing.

Another object of this invention is to provide a plate-making process which enables to effectively conduct the application of a developing ink after exposure and development of a PS plate without conducting water-washing.

Still another object of this invention is to provide a plate-making process in which the retouching process such as elimination or addition in image areas of the plate after a PS plate has been imagewise exposed and developed can be efficiently carried out without conducting water-washing.

DETAILED DESCRIPTION OF THE INVENTION

As a result of extensive investigations to achieve the above objects, it has been found that the gumming treatment of and the application of a developing ink on a PS plate which has been imagewise exposed and developed can be effectively carried out by processing the PS plate with an aqueous solution containing a surfactant even if a water-washing step is eliminated.

This invention is therefore to provide an improved plate-making process comprising the steps of imagewise exposing a presensitized plate comprising an aluminum support having thereon a light-sensitive layer, developing the imagewise exposed presensitized plate to remove either the exposed area or the unexposed area of the light-sensitive layer to reveal the surface of the aluminum support, processing the developed plate with an aqueous surfactant solution directly after the development without conducting water-washing, and subjecting the developed plate to a process selected from the group consisting of (i) application of a developing ink, (ii) retouching process and (iii) gumming process.

In addition, this invention provides a processing agent for use in processing a developed presensitized plate without conducting water-washing, which comprises an aqueous surfactant solution.

A suitable surfactant can be selected from a wide range of surfactants which include a nonionic surfactant such as polyoxyethylene alkyl ether, polyoxyethylene alkylphenyl ether, polyoxyethylene ester of aliphatic acid, sorbitan ester of aliphatic acid, polyoxyethylene sorbitan ester of aliphatic acid, or glycerin ester of an aliphatic acid; an anionic surfactant such as an aliphatic acid salt, a salt of alkyl sulfate ester, alkylbenzenesulfonate, alkylnaphthalenesulfonate, a salt of dialkylsulfosuccinate ester, a salt of alkyl phosphate ester, a condensate of naphthalene sulfonic acid with formalin, or a salt of a polyoxyethylene alkyl sulfate ester; and a cationic surfactant such as an alkylamine salt, quaternary ammonium salt, or polyoxyethylene alkylamine salt. Of these, polyoxyethylene alkyl ether, polyoxyethylene aliphatic acid ester, a salt of alkyl sulfate, an alkylbenzenesulfonate and a salt of a dialkylsulfosuccinate ester are preferred because these surfactants are capable of minimizing the decrease in the lipophilicity of the image area of a lithographic printing plate and the image area of a lithographic plate well attract a developing ink. The above described surfactants can be used independently or as a mixture. The surfactants are used in an amount within the range of from about 0.1 to about 20 wt%, preferably from 0.5 to 10 wt%, based on the total weight of the aqueous surfactant solution.

The aqueous surfactant solution is effective over a wide pH range, but it is preferred to adjust the pH value to the range of about 1.5 to about 12.5. In particular, when the developer for the PS plate is alkaline, the aqueous surfactant solution is preferably provided with abilities to neutralize the developer remaining on the developed PS plate and to reduce the pH of the remaining developer. These abilities are provided by adding an acid and a buffer to the aqueous surfactant solution.

Preferred examples of such acids and buffers are acids such as acetic acid, oxalic acid, tartaric acid, benzoic acid, molybdic acid, boric acid, nitric acid, sulfuric acid, phosphoric acid and polyphosphoric acid, and their water soluble alkali metal salts and ammonium salts. Specific examples are ammonium acetate, sodium acetate, potassium acetate, sodium molybdate, potassium molybdate, sodium borate, ammonium borate, lithium nitrate, sodium nitrate, potassium nitrate, sodium primary phosphate, sodium secondary phosphate, sodium tertiary phosphate, potassium primary phosphate, potassium secondary phosphate, potassium tertiary phosphate, ammonium tertiary phosphate, and sodium polyphosphate.

Details of buffers are described, for example, in *Kagaku Binran Kisohen II (Chemical Handbook, Fundamental Part II)*, 2nd Revision, edited by Japanese Chemical Society and published by Maruzen Co., pp. 1490 to 1499, and these buffers can be employed as they are in the present invention.

Since the processing ability of the aqueous surfactant solution of this invention (expressed in the area of the PS plate which can be processed with a unit volume of the processing solution) is increased by incorporation of a buffer, it is preferred to add a buffer to the aqueous surfactant solution.

Also, a lipophilic substance can be preferably used in the aqueous surfactant solution because such substance renders image areas of the lithographic printing plate much more lipophilic, whereby the developing ink can be applied more efficiently and moreover decrease in lipophilic properties of the image areas due to the gumming-up can be markedly prevented. Preferred examples of suitable lipophilic substances include an aliphatic carboxylic acid having 5 to 25 carbon atoms such as oleic acid, lauric acid, valeric acid, nonylic acid, capric acid, myristic acid and palmitic acid, as well as castor oil. Whether used independently or as a mixture, these lipophilic substances are used in an amount within the range of from about 0.005 to about 10 wt%, preferably from 0.05 to 5 wt%, based on the total weight of the aqueous solution containing a surfactant.

The aqueous surfactant solution of this invention can be advantageously used in processing lithographic printing plates obtained by exposure and development of various PS plates without conducting water-washing. In particular, excellent effects can be obtained when a positive working PS plate wherein a light sensitive layer comprising an o-naphthoquinonediazide compound is provided on an aluminum plate is used. Such a positive working PS plate is described in detail in U.S. Pat. Nos. 3,635,709, 4,028,111 and 4,139,384.

In the process of this invention, it is preferred to minimize the amount of the developer remaining on the lithographic printing plate after development. The amount of the developer remaining on the lithographic printing plate after squeezing is preferably 10 ml/m$^2$ or less and more preferably 5 ml/m$^2$ or less, with the most preferred amount being 3 ml/m$^2$ or less. The presence of the developer in amounts of 10 ml/m$^2$ or more accelerates the deterioration of the aqueous surfactant solution. In particular, when a large number of PS plates are processed with a given amount of the same aqueous surfactant solution, the processing ability of the aqueous surfactant solution is quickly reduced.

Squeezing of the surface of the lithographic printing plate can be achieved by various methods including a method in which the lithographic printing plate is passed between a pair of rollers with an elastic material, such as rubber, coated on the roller surface and the developer on the plate is removed by the nip pressure, and a method in which an elastic plastic member with a smooth surface is placed along a path along which the lithographic printing plate is to be conveyed and the developer on the surface of the plate is removed by rubbing with the elastic plastic member.

The lithographic printing plate thus developed is treated with the aqueous surfactant solution of this invention without being washed with water. Various methods can be employed for this treatment, including a method in which a suitable amount of the aqueous surfactant solution is poured onto the plate and spread on the entire surface of the plate by rubbing with a sponge, a method in which the plate is immersed into a container filled with the aqueous solution, a method in which the aqueous surfactant solution is coated on the plate with a roller, and a method in which the aqueous surfactant solution is sprayed on the plate.

The thus processed lithographic printing plate can be subjected to various treatments such as the application of a developing ink, the retouching represented by addition or elimination of images, and the gumming-up. For the lithographic printing plate prepared by this invention, these treatments can be carried out efficiently and without causing any problem.

A plate-making method has been known in which the water-washing step after development is eliminated by subjecting a PS plate to the gumming treatment immediately after the exposure and development of the PS plate without washing with water. According to this method, however, the processing ability of a plate-protecting agent used in the gumming treatment is inevitably reduced in comparison with the plate-making method in which the water-washing is applied. In addition, it is practically impossible to coat a developing ink on and retouch the lithographic printing plate which has not been washed with water after the development.

For the lithographic printing plate obtained by the plate-making method of this invention, a reduction in processing ability of the plate-protecting agent is small even if the gumming treatment is applied immediately. In addition, the coating of a developing ink and the retouching can be carried out with ease of an extent almost similar to that in the case of the lithographic printing plate which has been fully washed with water after development.

The following examples are given to illustrate this invention in greater detail. Unless otherwise indicated, all percents are by weight.

EXAMPLES 1 TO 8 AND COMPARATIVE EXAMPLES 1 TO 2

A mechanically grained 2S aluminum substrate was partially etched by immersion in a 2% aqueous solution of sodium hydroxide at 40° C. for a period of 1 minute. After washing with water, the aluminum substrate was immersed in a mixture of sulfuric acid and chromic acid for a period of about 1 minute to expose the surface of pure aluminum. The substrate was then immersed in 20% sulfuric acid at 30° C., and subjected to anodization at a D.C. voltage of 1.5 V and a current density of 3 A/dm$^2$, followed by washing with water and drying. Subsequently, a roll coater was used to coat continuously the substrate with a sensitive solution of the following formulation until the dry coating weight was 2 g/m$^2$.

| Photosensitive Solution | |
|---|---|
| Naphthoquinone-1,2-diazide(2)-5-sulfonic acid ester of acetone-pyrrogallol resin (as synthesized according to the method described in Example 1 of U.S. Pat. No. 3,635,709) | 5 g |
| Tertiary-butylphenol/formaldehyde resin | 0.5 g |
| Cresol/formaldehyde resin | 5 g |
| Methyl ethyl ketone | 50 g |
| Cyclohexanone | 40 g |

The thus presensitized lithographic printing plate was set in a vaccum printing frame and exposed to the light from a 3 KW metal halide lamp sold by Fuji Photo Film Co., Ltd. through a positive film at a distance 1 meter for a period of 30 seconds. Subsequently, the plate was immersed in a developing solution of the following formulation.

| Developer Solution | |
|---|---|
| Sodium silicate JIS No. 3 | 10 g |
| Aerosol OS (sodium isopropylnaphthalene-sulfonate manufactured by American Cyanamide Co.) | 20 g |
| Benzyl alcohol | 30 g |
| Water added to make 1000 ml | |

On the other hand, the processing solutions having a formulations shown in the following Table 1 are prepared.

TABLE 1

| Ingredients (g) | Processing Solution No. | | | | | | | |
|---|---|---|---|---|---|---|---|---|
|  | 1 | 2 | 3 | 4 | 5 | 6 | 7 | 8 |
| Water | 1,000 | 1,000 | 1,000 | 1,000 | 1,000 | | | 1,000 |
| Phosphoric Acid (85%) | 40 | 40 | | 40 | | | | 30 |
| Sodium Salt of Lauryl Alcohol Sulfuric Acid Ester | 40 | | 2 | | | | | |
| Sodium Oleylsulfate | | 20 | | | | | | 30 |
| Sodium Di(2-ethylhexyl) sulfosuccinate | | | 40 | | | 20 | 20 | |
| Polyoxyethylene Cetyl Ether (HLB = 13) | | | | | 50 | | | |
| Polyoxyethylene Stearate (HLB = 16) | | | | | | 20 | | |
| Aqueous Sodium Secondary Phosphate-Citric Acid Solution (Buffer Solution of pH 5) | | | | | | 1,000 | | |
| Castor Oil | | | | | | | 3 | |
| Aqueous Phosphoric Acid-Sodium Hydroxide Solution (Buffer Solution of pH 4) | | | | | | | 1,000 | |
| Sodium Hydroxide | | | | | | | | 10 |

Ten lithographic printing plates were prepared by the method as described above and the developer on the plate was fully squeezed. A small amount of each of the processing solutions was poured on the plate and spread to cover the whole surface. For comparison, one of the plates was washed with water, squeezed out the water and then dried (Comparative Example 1), and on another plate, a small amount of water was poured and spread to cover the whole surface (Comparative Example 2).

Each plate was divided into two parts. One of the parts was treated with a gum solution available on the market and printed by a conventional procedure. The number of sheets of paper that was wasted until a printed reproduction with a sufficient greasy ink density was obtained was counted, and the scumming in non-image areas of the printed reproduction was examined. The other part was coated with a developing ink available on the market by a usual procedure and the time required for coating a sufficient amount of the developing ink on image areas by a conventional procedure was measured.

The results are shown in Table 2.

TABLE 2

| | Processing Solution No. | Number of Wasted Sheets | Scumming | Time for coating Developing Ink (seconds) |
|---|---|---|---|---|
| Example 1 | 1 | 15 | None | 20 |
| Example 2 | 2 | 12 | " | 19 |
| Example 3 | 3 | 5 | " | 18 |
| Example 4 | 4 | 15 | " | 21 |
| Example 5 | 5 | 15 | " | 20 |
| Example 6 | 6 | 10 | " | 20 |
| Example 7 | 7 | 5 | " | 20 |
| Example 8 | 8 | 8 | " | 25 |
| Comparative Example 1 | Washing with Water | 20 | " | 20 |
| Comparative Example 2 | Small Amount of Water | 40 | Slight Scumming | 35 |

From the results illustrated in Table 2, it can be seen that the printing plates produced by the method of this invention can be coated with a developing ink with effectiveness equal to that in the case of application of sufficient water-washing after development, and in that the printing plates are superior in the number of wasted sheets to the comparative plates.

EXAMPLES 9 TO 11 AND COMPARATIVE EXAMPLES 3 TO 4

A 0.24 mm thick aluminum substrate was degreased by immersion in a 7% aqueous solution of sodium tertiary phosphate at 60° C., and after water washing, a suspension of pumice in water was poured on the substrate while it was grained by rubbing with a nylon brush. After washing with water, the grained substrate was immersed for a period of 30 to 60 seconds in a 5% aqueous solution of sodium silicate JIS No. 3 (molar ratio of $SiO_2$ to $Na_2O = 3.1$ to 3.3) which was controlled at 70° C.

After thorough washing with water, the substrate was dried and coated with a sensitive solution of the following formulation.

| Photosensitive Composition | |
|---|---|
| A copolymer of 2-hydroxyethyl methacrylate (as synthesized according to the method described in Example 1 of U.S. Pat. No. 4,123,276) | 0.87 g |
| Salt of 2-methoxy-4-hydroxy-5-benzoyl-benzenesulfonic acid with a condensate of p-diazodiphenylamine and paraformaldehyde | 0.1 g |

| Photosensitive Composition | |
|---|---|
| Oil Blue #603 (C.I. 74350, a product of Orient Chemical Industries Co., Ltd.) | 0.03 g |
| 2-Methoxyethanol | 6 g |
| Methanol | 6 g |
| Ethylene dichloride | 6 g |

The sensitive solution was applied such that the dry coating weight was 1.0 g/m². The plate was exposed through a negative transparency for a period of 40 seconds to a carbon arc lamp of 30 ampere placed at a distance of 70 cm. Subsequently, the plate was immersed in a developing solution of the following formulation at room temperature for a period of 1 minute, and the surface of the plate was lightly rubbed with absorbent cotton to remove the unexposed area.

| Developer Solution | |
|---|---|
| Sodium sulfite | 3 g |
| Benzil alcohol | 30 g |
| Triethanolamine | 20 g |
| Monoethanolamine | 5 g |
| Sodium t-butylnaphthalene Sulfonate | 30 g |
| Water | 1,000 ml |

The lithographic printing plate was treated with Processing Solution Nos. 1, 4 and 7 used in Examples 1, 4 and 7, respectively, in the same manner as in Example 1. Separately the lithographic printing plate was processed in the same manner as in Comparative Examples 1 and 2.

For each of the thus obtained lithographic printing plates, the number of wasted sheets, the scumming, and the time required for coating a developing ink were measured.

The results are shown in Table 3.

TABLE 3

| | Processing Solution No. | Number of Wasted Sheets | Scumming | Time for Coating Developing Ink (seconds) |
|---|---|---|---|---|
| Example 9 | 1 | 25 | None | 25 |
| Example 10 | 4 | 20 | " | 25 |
| Example 11 | 7 | 15 | " | 23 |
| Comparative Example 3 | Washing with Water | 40 | " | 25 |
| Comparative Example 4 | Small Amount of Water | 80 | Slight Scumming | 35 |

From the results shown in Table 3, it can be seen that the printing plates produced by the method of this invention are equal in the time of coating a developing ink and superior in the number of wasted sheets to those comparative plates produced by the conventional procedure in which sufficient water-washing is conducted after development.

While the invention has been described in detail and with reference to specific embodiments thereof, it will be apparent to one skilled in the art that various changes and modifications can be made therein without departing from the spirit and scope thereof.

What is claimed is:

1. In a plate-making process comprising the steps of (a) imagewise exposing a presensitized plate comprising an aluminum support having thereon a light-sensitive layer, (b) developing said imagewise exposed presensitized plate to remove either the exposed area or the unexposed area of said light-sensitive layer to reveal the surface of said aluminum support and (c) subjecting said developed plate without conducting water washing to a process selected from the group consisting of (i) application of a developing ink, (ii) retouching process and (iii) gumming process, the improvement which comprises processing the developed plate with an aqueous solution consisting essentially of a surfactant between step (b) and (c).

2. The process of claim 1, wherein said light-sensitive layer comprises o-naphthoquinonediazide compound.

3. The process of claim 2, wherein said surfactant is at least one selected from the group consisting of polyoxyethylene alkyl ethers, polyoxyethylene aliphatic acid esters, salts of alkyl sulfate esters, alkylbenzene sulfonates and salts of dialkyl sulfosuccinates.

4. The process of claim 3, wherein said aqueous surfactant solution further contains buffering agent so as to adjust pH of said solution in a range of from 1.5 to 12.5.

5. The process of claim 4, wherein said aqueous surfactant solution further contains a lipophilic material.

6. The process of claim 5, wherein said lipophilic material is selected from the group consisting of oleic acid, lauric acid, valeric acid, nonylic acid, capric acid, myristic acid, palmitic acid and castor oil.

7. The process of claim 2, wherein said aqueous surfactant solution consists of 0.5 to 10 wt% of a surfactant, a buffering agent to adjust pH of said solution to 1.5 to 12.5, 0 to 5 wt% of a lipophilic material and balance of water.

8. The process of claim 3, wherein said surfactant is a salt of dialkyl sulfosuccinate.

9. The process of claim 8, wherein said surfactant is sodium di(2-ethylhexyl)sulfosuccinate.

10. The process of claim 3, wherein said surfactant presents in an amount between 0.5 and 10% by weight based on the total weight of said aqueous surfactant solution.

11. The process of claim 2, wherein said aqueous solution consists of at least one surfactant, a buffering agent to adjust pH of said solution in the range of from about 1.5 to about 12.5 and water.

12. The process of claim 11, wherein said at least one surfactant is selected from the group consisting of polyoxyethylene alkyl ethers, polyoxyethylene aliphatic esters, salts of alkyl sulfate esters, alkylbenzenesulfonates, salts of dialkyl sulfosuccinates and mixtures thereof.

13. The process of claim 1, wherein said aqueous solution consisting essentially of said surfactant contains between about 0.1 to about 20 wt.% surfactant based on the total weight of the aqueous surfactant solution.

14. The process of claim 1, wherein said presensitized plate, following developing, has less than 10 ml/m² developer remaining on the plate.

* * * * *